US010297567B2

(12) United States Patent
Lu et al.

(10) Patent No.: US 10,297,567 B2
(45) Date of Patent: May 21, 2019

(54) THERMOCOMPRESSION BONDING USING PLASMA GAS

(71) Applicant: Intel Corporation, Santa Clara, CA (US)

(72) Inventors: Donglai David Lu, Chandler, AZ (US); Jimin Yao, Chandler, AZ (US); Amrita Mallik, Chandler, AZ (US); George S. Kostiew, Chandler, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/974,823

(22) Filed: Dec. 18, 2015

(65) Prior Publication Data

US 2017/0179070 A1 Jun. 22, 2017

(51) Int. Cl.
*H01L 23/00* (2006.01)

(52) U.S. Cl.
CPC .............. *H01L 24/81* (2013.01); *H01L 24/75* (2013.01); *H01L 2224/753* (2013.01); *H01L 2224/7525* (2013.01); *H01L 2224/7592* (2013.01); *H01L 2224/75981* (2013.01); *H01L 2224/81203* (2013.01); *H01L 2924/01001* (2013.01); *H01L 2924/0101* (2013.01); *H01L 2924/01002* (2013.01); *H01L 2924/01007* (2013.01); *H01L 2924/01018* (2013.01); *H01L 2924/01036* (2013.01); *H01L 2924/01054* (2013.01)

(58) Field of Classification Search
CPC ................................. H01L 24/75; H01L 24/84
See application file for complete search history.

(56) References Cited

U.S. PATENT DOCUMENTS

| 4,913,790 | A | * | 4/1990 | Narita | ..................... C23C 14/02 204/192.13 |
| 6,046,076 | A | * | 4/2000 | Mitchell | ................. H01L 21/56 257/E21.502 |
| 2001/0015261 | A1 | | 8/2001 | Kobayashi et al. | |
| 2002/0048844 | A1 | | 4/2002 | Sakaguchi | |
| 2002/0139794 | A1 | * | 10/2002 | Budinger | ............... B23K 1/002 219/615 |

(Continued)

FOREIGN PATENT DOCUMENTS

WO WO-2017105763 A1 6/2017

OTHER PUBLICATIONS

"International Application Serial No. PCT/US2016/062734, International Search Report dated Mar. 20, 2017", 4 pgs.

(Continued)

*Primary Examiner* — Dale E Page
*Assistant Examiner* — Quovaunda Jefferson
(74) *Attorney, Agent, or Firm* — Schwegman Lundberg & Woessner, P.A.

(57) ABSTRACT

Described herein are devices and techniques for thermocompression bonding. A device can include a housing, a platform, and a plasma jet. The housing can define a chamber. The platform can be located within the chamber and can be proximate a thermocompression chip bonder. The plasma jet can be located proximate the platform. The plasma jet can be movable about the platform. The plasma jet can include a nozzle arranged to direct a plasma gas onto the platform. Also described are other embodiments for thermocompression bonding.

23 Claims, 5 Drawing Sheets

(56) References Cited

U.S. PATENT DOCUMENTS

| | | | |
|---|---|---|---|
| 2003/0073312 A1* | 4/2003 | Celii | H01L 21/31116 438/689 |
| 2003/0213436 A1* | 11/2003 | Kwon | C23C 16/34 118/725 |
| 2006/0278835 A1* | 12/2006 | Taskar | F16K 35/06 251/90 |
| 2009/0145546 A1* | 6/2009 | Inamoto | H01L 24/75 156/272.6 |
| 2009/0286382 A1* | 11/2009 | Huff | C23F 4/00 438/455 |
| 2010/0304151 A1* | 12/2010 | Tuennermann | C03B 23/203 428/428 |
| 2011/0045206 A1 | 2/2011 | Shang et al. | |
| 2013/0256269 A1 | 10/2013 | Nikkhoo | |

OTHER PUBLICATIONS

"International Application Serial No. PCT/US2016/062734, Written Opinion dated Mar. 20, 2017", 8 pgs.

* cited by examiner

THERMOCOMPRESSION BONDING USING PLASMA GAS

TECHNICAL FIELD

Embodiments described generally herein relate to thermocompression bonding. Some embodiments relate to using plasma gas to remove oxide layers during a thermocompression bonding process.

BACKGROUND

Thermocompression bonding describes a wafer bonding technique and is also referred to as diffusion bonding, pressure joining, thermocompression welding or solid-state welding. Two metals, e.g. gold (Au)-gold (Au), are brought into atomic contact applying force and heat simultaneously. The diffusion requires atomic contact between the surfaces due to the atomic motion. The atoms migrate from one crystal lattice to the other one based on crystal lattice vibration. This atomic interaction sticks the interface together.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Thermocompression bonding (TCB) can be used in a flip chip bonding process. To create a thermocompression joint a substrate can first be sprayed with water-soluble flux for oxide removal. After flux removal of the oxide, the substrate can be heated to roughly 250-300° C. Once heated, the substrate and other components can be pressed together for a certain time with a defined bonding force to form a joint.

The joint can build up by diffusion welding. Once the components are bonded together, a deflux process can be employed to remove the flux residue from the joint area. The systems and methods disclosed herein allow for a configuration of fluxless TCB. The systems and methods disclosed herein can use a localized reducing plasma gas. The plasma gas can remove metal oxides from components prior to bonding. Using a plasma gas for oxide removal can lead to a significant cost decrease for chip attachment by eliminating flux dispense and deflux processes.

Figure 1A:
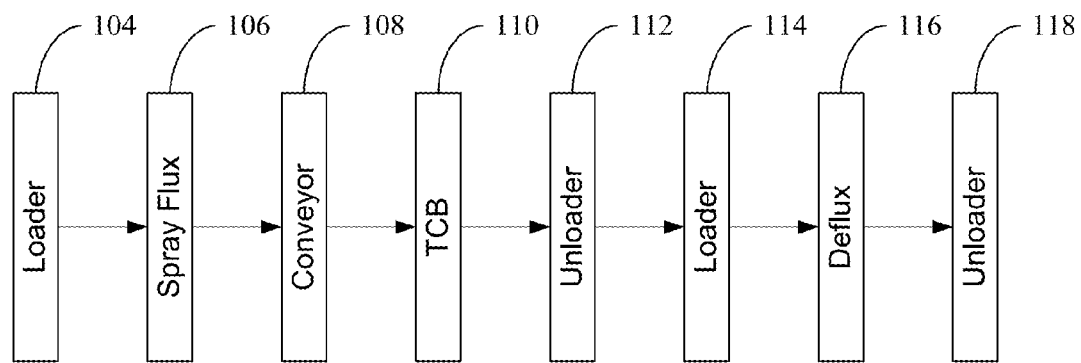
FIGS. 1A and 1B illustrate a process diagram for thermocompression bonding in accordance with some embodiments.
Figure 1B:
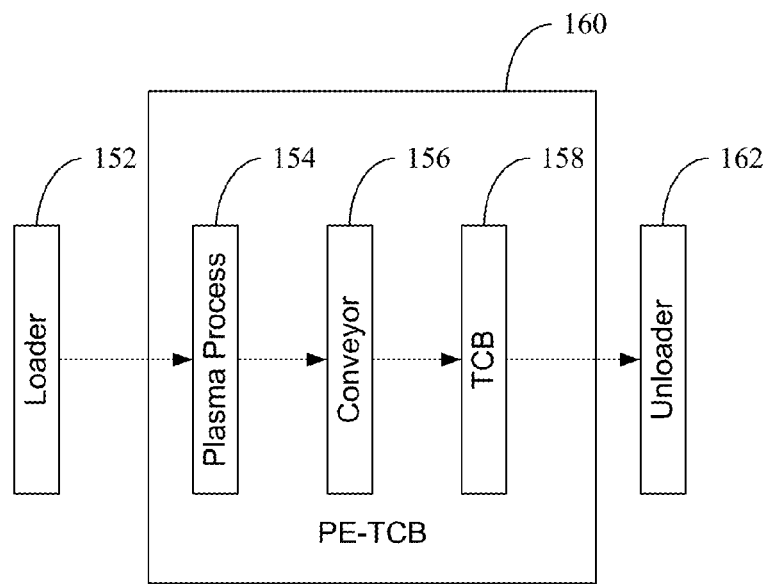

FIG. 1B shows process diagram for a comparison of a TCB process 102. As shown in FIG. 1, the TCB process 102 includes a loader operation 104. During the loader operation 104, the various components can be loaded into a TCB fixture or substrate in preparation for a TCB operation 110. Once the loader operation 104 is complete, the various components can be passed to a spray flux operation 106. During the spray flux operation 106, the various components can be sprayed with a flux solution. The flux solution can remove an oxide layer.

From the spray flux operation 106, the various components can move to a conveyor operation 108. The conveyor operation 108 can be used to move the various components into a TCB machine. In other words, from the conveyor operation 108, the various components can move to the TCB operation 110. During the TCB operation 110 the various components can be compressed at high temperature and pressure to fuse the various components together. From the TCB operation 110, the now fused components can move to an unloader operation 112, where the fused components can be unloaded from the TCB fixture.

Once the fused components have been unloaded from the TCB fixture, the fused components can be loaded into a deflux fixture at a loader operation 114. From the loader operation 114, the fused components can enter a deflux operation 116. During the deflux operation 116, the fused components can be washed with a solution to remove excess or remaining flux solution from the fused components. Once the fused components have been defluxed at the deflux operation 116, the fused components can be removed from the deflux fixture at an unloader operation 118.

FIG. 1B shows a process diagram for a fluxless-TCB process 150. The fluxless-TCB process 150 can include a loader operation 152. During the loader operation 152, the various components can be loaded into a PE-TCB fixture or substrate in preparation for a TCB process 158. Once the loader operation 152 is complete, the various components can be subjected to a plasma process 154. During the plasma process 154, which can occur at a high pressure or atmospheric pressure, the plasma gas, or components of the plasma gas can react with the oxide layer on the various components. The reaction can cause the oxide layer to break free from the various components. Thus, the plasma process 154 can remove the oxide layer from the various components.

From the plasma process 154, the various components can move to a conveyor operation 156. The conveyor operation 156 can be used to move the various components into a TCB machine or to another location within the TCB machine. Stated another way, from the plasma process 154, the various components can move to a TCB process 158 via conveyor operation 156. During the TCB process 158 the various components can be compressed at high temperature and pressure to fuse the various components together.

While FIG. 1B shows three separate processes for the plasma process 154, conveyor operation 156, and TCB process 158, the processes can be combined as the PE-TCB process 160. For example, the conveyor operation 156 can be eliminated and the plasma process 154 can occur at the fixture holding the various components at the TCB process 158. As a result, the time between the plasma process 154 and the TCB process 158 can be minimized and the various components do not need to be removed from a TCB box or the plasmas atmosphere between the plasma process 154 and the TCB process 158. Consequently, the risk of re-oxidation can be minimized as well as equipment such as a conveyor can be eliminated to reduce manufacturing costs.

From the TCB process 158 or PE-TCB process 160, the now fused components can move to an unloader operation 162, where the fused components can be unloaded from the PE-TCB fixture. As shown in FIG. 1B, the fluxless-TCB process 150 can eliminate various operations that are used with the flux based TCB process 102.

The reduction in operations can eliminate equipment or cause equipment to be downsized. The fluxless-TCB process 150 disclosed herein can also lead to conservation of materials, which can be a further cost savings. For example, the deflux operation 116 has the potential to be one of the highest consumers of resources in the flux based TCB process 102 using an estimated 120 kW of electricity and 4.5 GPM of deionized water when operating 24 hours per day, 7 days per week. Using the fluxless-TCB process 150 disclosed herein, the operating cost can be reduced by an estimated $80,000 per year. Furthermore, eliminating the flux and water consumption can have a large environmental impact and cost savings. Furthermore, the fluxless-TCB process 150 disclosed herein can lead to a higher throughput and thus, significant cost saving due to higher reactivity of hydrogen plasma.

During the plasma process 154, a reducing plasma gas or other reducing gas can be used to remove the oxide layer. The reducing plasma (hereinafter referred to as plasma gas) can be a multipart mixture. At least one part of the plasma gas can be a reaction gas that can react with the oxide layer. For example, hydrogen, $H_2$, can be used as the reaction gas. During the plasma process 154, the reaction gas can react with the oxide layer to form a compound, such as $H_2O$, thereby removing the oxide layer from the various components.

Another part of the plasma gas can be a carrier gas. The carrier gas can have multiple functions. The carrier gas can be used to carry the reaction gas into a plasma chamber or other structure where the plasma process 156 can occur. In addition, the carrier gas can be used to carry the product of the reaction gas and the oxide layer away from the various components. For example, if the reaction gas is hydrogen, the reaction with the oxide layer can form water in a vapor state. The carrier gas can then be used to carry the water vapor away from the various components.

As disclosed herein, the plasma gas can be a mixture of gases, such as a binary gas mixture. For instance, mixtures such as $N_2/H_2$ and $Ar/H_2$ can be used as the plasma gas. The reaction gas (sometimes referred to as a reducing gas) can effectively reduce the various metal oxides such as copper oxides and tin oxides. In the plasma process 154, the mixture of reaction gas to carrier gas can range from about 2% to about 12% reaction gas and about 98% to about 88% carrier gas. The carrier gas can be any inert gas. The plasma gas can include one or more reaction gases and one or carrier gases. Non-limiting examples of a reaction gas include hydrogen, formic acid, or any compound that can react with the oxide layer to strip the oxide layer from the substrate. Non-limiting examples of a carrier gas include helium, neon, argon, krypton, xenon, or nitrogen.

The plasma process 154 can be carried out in a chamber or other equipment that is used for the TCB process 158. Having the plasma process 154 take place is close proximity to the TCB process 158 can reduce the risk of re-oxidation occurring post plasma treatment. In addition, the systems and methods using a plasma treatment disclosed herein can be applied for metal interconnect joint such as solder to solder, solder to copper, solder to nickel, copper to copper, etc.

Figure 2:
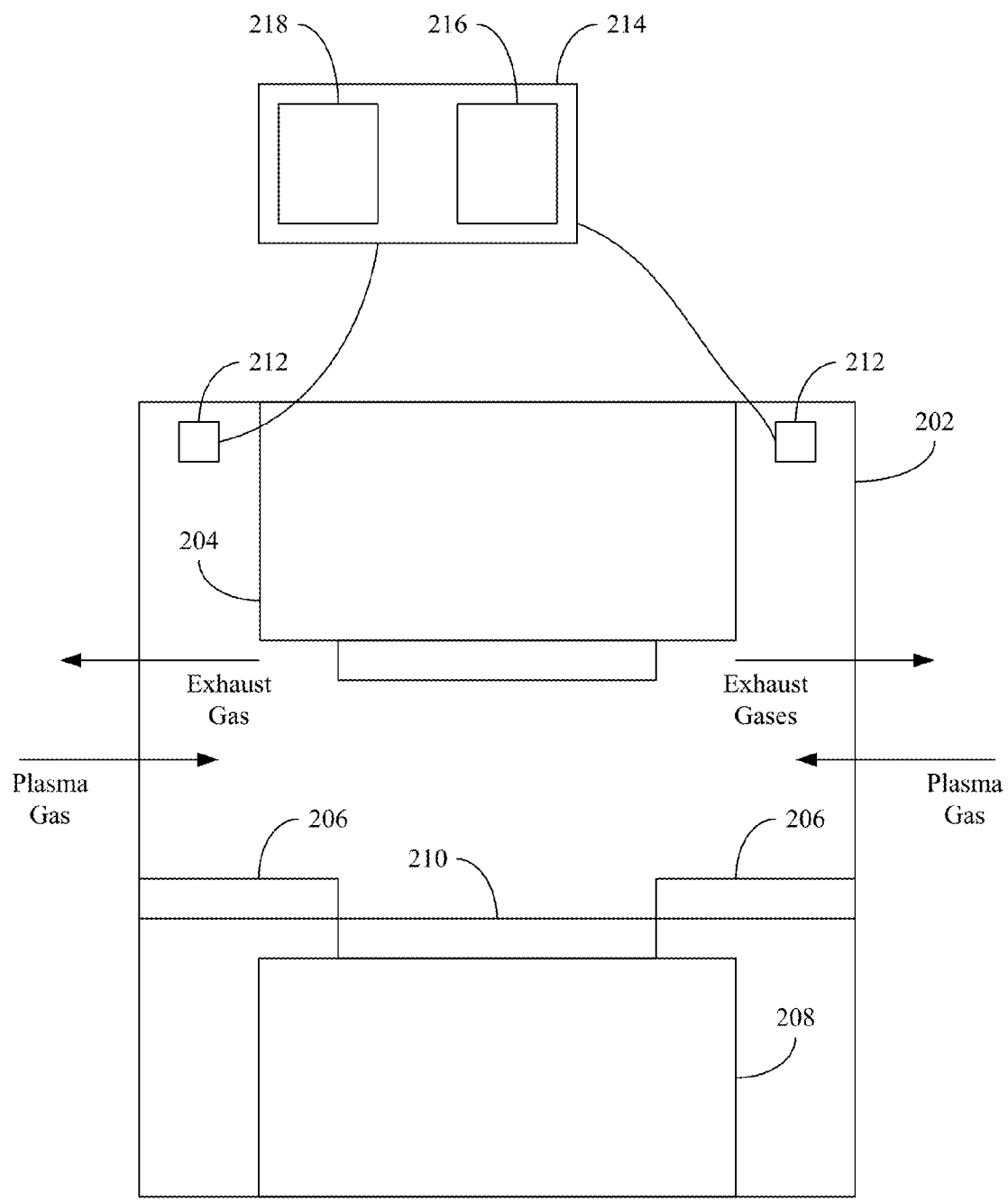
FIG. 2 illustrates an example configuration for a plasma-enhanced thermocompression bonding process in accordance with some embodiments.

FIG. 2 illustrates an example configuration for the fluxless-TCB process 150. As shown in FIG. 2, a housing 202 that can define a chamber. Located inside the housing 202 can be a thermocompression chip bonder 204, a bonding window 206, and a platform 208. The platform 208 can support a substrate 210. The bonding window 206 can be located proximate the platform 208 and the substrate 210. The substrate 210 can include a fixture or other devices that can be used to hold the various components that are to be bonded together using the fluxless-TCB process 150. In addition, the substrate 210 can be one of the various components that are to be bonded together using the fluxless-TCB process 150.

Figure 3:
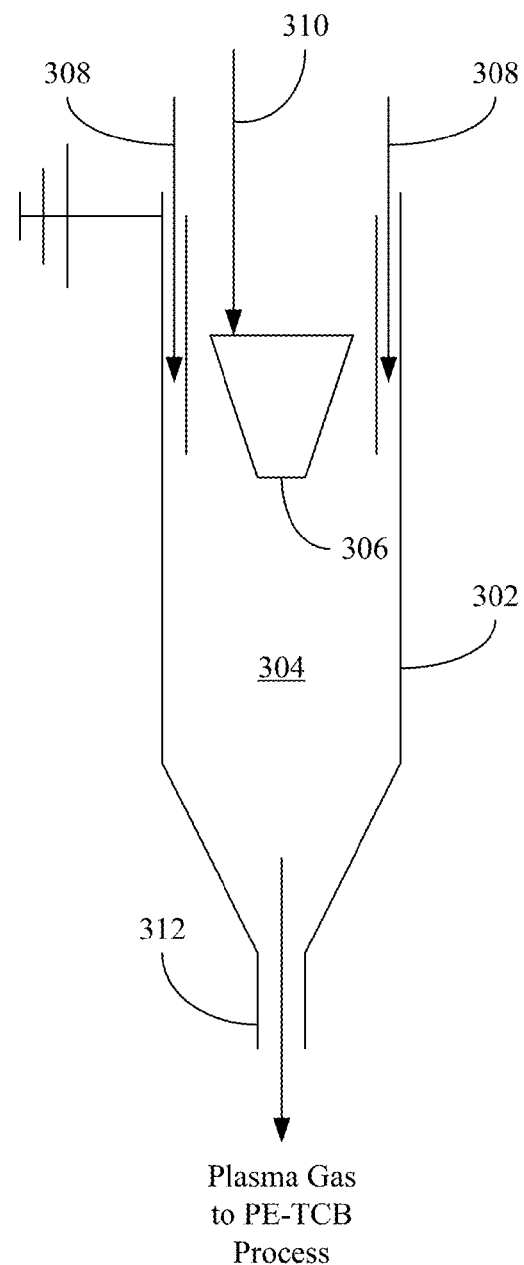
FIG. 3 illustrates an example plasma jet in accordance with some embodiments.

During the fluxless-TCB process 150 and as shown in FIG. 2, the plasma gas can be injected into the chamber defined by the housing 202. Consistent with various embodiments disclosed herein, the plasma gas can be injected into the chamber as a mixture of the reaction gas and the carrier gas. In addition, the reaction gas can be injected into the chamber at one or more injection points and the carrier gas can be injected into the chamber at different injection points. Furthermore, the carrier gas can be separately injected into the chamber to create an inert atmosphere within the housing 202. FIG. 3, described below, shows an example plasma jet 300 that can be used to deliver the plasma gas within the housing 202.

Prior to injecting the plasma gas, atmospheric air or other contaminating gases can be removed by creating a vacuum within the chamber. In addition, atmospheric or other contaminating gases can be removed from the chamber by injecting an inert gas or the plasmas gas into the chamber while withdrawing gases. Furthermore, during the plasma process 154 exhaust gases can be evacuated from the chamber as more plasma gas is injected into the chamber. For example, during the plasma process 154, water vapor created by the reaction between the reaction gas and the oxide layer can be removed by one or more exhaust fans in fluid communication with the chamber. For instance, the plasma gas may be a nitrogen/hydrogen mixture. During the plasma process 154, the hydrogen can react with the oxide layer on a copper substrate (e.g., any oxide of copper) to form water vapor. The water vapor can mix with the carrier gas, nitrogen, and be removed from the housing 202 via exhaust ducts.

Furthermore, the plasma gas can be injected into the housing such that a positive pressure differential is created between the chamber and the surrounding. The positive pressure differential can assist in preventing contaminant particles such as dust and contaminant gases, such as atmospheric oxygen, from entering the chamber. In addition, the plasma jet 300 and exhaust ducts can be positioned in a manner to create a circular flow pattern, or other types of flow patterns such that a plasma gas (e.g., hydrogen) rich environment can exist near the bond pedestal or substrate 210.

In addition, the chamber can include one or more sensors 212. The sensors 212 can measure a variety of conditions within the chamber. For example, the sensors 212 can be located in various positions within the chamber and can measure the concentration of various gases within the chamber. For example, the sensors 212 can measure the concentration of the plasma gas, humidity within the chamber, and detect any contaminate gases. In addition, the sensors 212 can measure pressure and temperature within the chamber.

The sensors 212 can be connected to a circuit configured to receive signals from the sensors 212 and send signals to the sensors 212. For example the sensors 212 can be connected to a controller 214. The controller 214 can use the readings from the sensors 212 to control the fluxless-TCB process 150. For example, the controller 214 can include a processor 216 and a memory 218. The memory 218 can include instructions that, when executed by the processor 216, cause the processor 216 to perform various operations. For example, the operations can include receiving, from the sensors 212, signals that indicate pressure, temperature, and concentration of the gases within the chamber.

In addition, the instructions can include causing the processor 216 to send signals to pumps, heaters, valves, etc. The signals sent to the pumps and valves can cause the pumps and valves to increase the flow of plasma gas into the chamber. In addition, the pumps and valves can be used to control pressure within the chamber. For example, should the pressure within the chamber exceed a safe level, the pumps and valves can be used to evacuate the chamber and reduce the pressure below the safe level. Stated another way, a circuit can be connected to the sensors 212 and can be configured to control pumps, valves, etc. to control a flow rate of the plasma gas or the various components of the plasma gas individually.

As described herein, the chemical reactions caused by the plasma gas can include:

$$Cu_2O + H_2 \rightarrow 2Cu + H_2O \quad \text{Equation I}$$

$$CuO + H_2 \rightarrow Cu + H_2O \quad \text{Equation II}$$

$$Cu_2O_3 + 3H_2 \rightarrow 2Cu + 3H_2O \quad \text{Equation III}$$

$$SnO + H_2 \rightarrow Sn + H_2O \quad \text{Equation IV}$$

$$SnO_2 + 2H_2 \rightarrow Sn + 2H_2O \quad \text{Equation V}$$

While Equations I-V show hydrogen as the reaction gas, other gases that will react with the oxidation layer can be used. As shown by Equations I-V, during the fluxless-TCB process 150, the tin oxide and copper oxide, regardless of the oxidation state of the tin or copper, layer can be effectively removed by a hydrogen plasma. As discussed herein, the reduction rate of a copper oxide layer by a plasma gas including hydrogen and nitrogen can be as much as 50-100 nm/min as measured by sequential electrochemical analysis (SERA).

FIG. 3 shows an example of the plasma jet 300 consistent with embodiments disclosed herein. As shown in FIG. 3, the plasma jet 300 can include a ring electrode 302 that can define a discharge chamber 304. Inside the ring electrode 302 can be an inner electrode 306. During operation, a gas 308 can enter the ring electrode 302 along with a high voltage current 310. As the gas 308 passes through the discharge chamber 304, a plasma can be formed and exit through a nozzle 312 of the plasma jet 300.

The voltage used in the plasma jet 300 can range from about 250V to 300V. The distance the plasma jet 300 can be from the components undergoing the plasma process can be about 2 mm to 10 mm and the speed the plasma jet 300 can travel can be about 5 mm/s to 100 mm/s. The flow rate of the plasma gas can be about 2 L/min to 10 L/min.

Figure 4A:
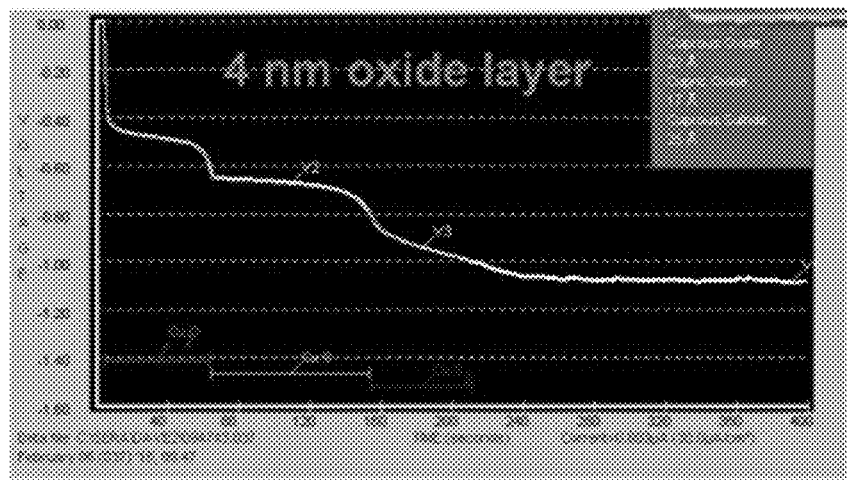
FIGS. 4A and 4B illustrate a measurement of a copper oxide layer before and after a plasma treatment, respectively, in accordance with some embodiments.
Figure 4B:
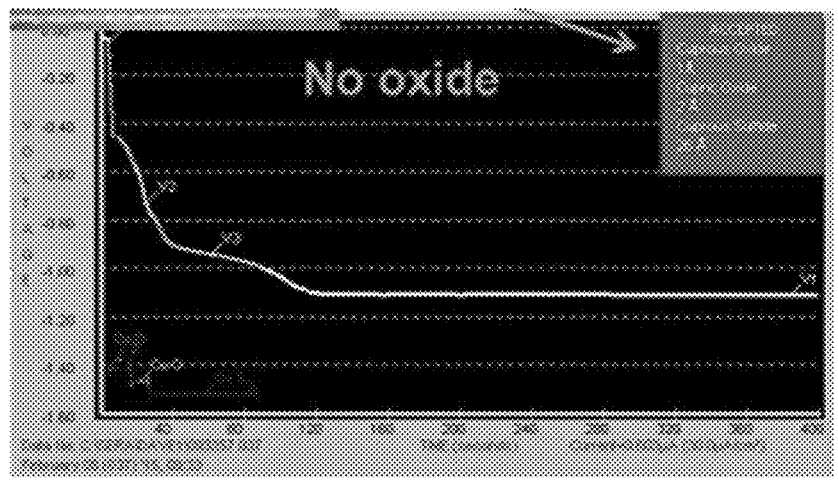

FIG. 4A illustrates a measurement of a copper oxide layer sample before treatment with the plasma process 154. As shown in FIG. 4A, the cuprous oxide ($Cu_2O$) and cupric oxide (CuO) layers measure 22 and 17 angstroms, respectively. FIG. 4B illustrates a measurement of a copper oxide layer sample after treatment with the plasma process 154. As shown in FIG. 4B, the cuprous oxide and cupric oxide layers measure 1 and 2 angstroms, respectively. In other words, the plasma process 154 resulted in a 95.5% and 88.2% reduction in the oxide layers.

Figure 5A:
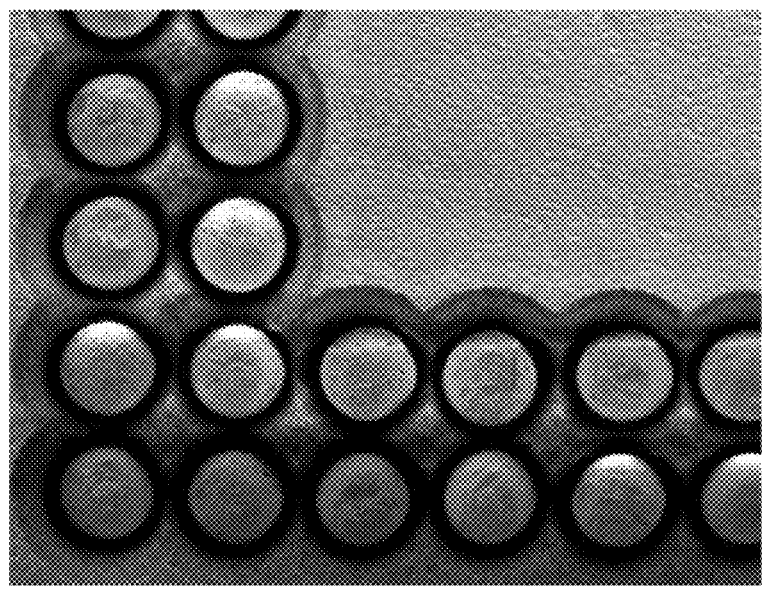
FIGS. 5A and 5B illustrate tin samples before and after a plasma treatment, respectively, in accordance with some embodiments.
Figure 5B:
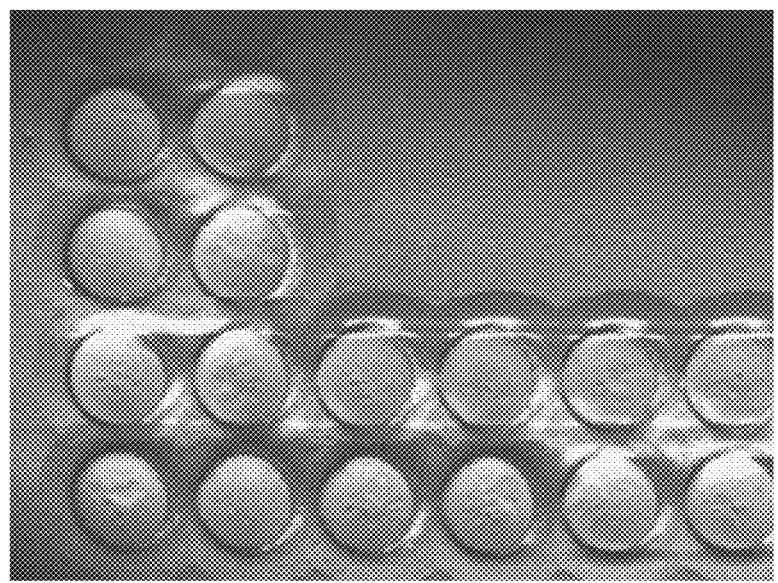

FIG. 5A shows a tin sample prior to treatment with the plasma process 154. FIG. 5B shows the tin sample after treatment with the plasma process 154. The sample shows tin soldering. As can be seen in the FIG. 5B, the plasma process 154 has significantly, if not completely, removed the tin oxide layer.

ADDITIONAL NOTES & EXAMPLES

In Example 1, a compression bonding system can be provided. The compression bonding system can include a housing, a platform, and a plasma jet. The housing can define a chamber. The platform can be located within the chamber and proximate a thermocompression chip bonder. The plasma jet can be located proximate the platform and can be movable about the platform. The plasma jet can include a nozzle arranged to direct a plasma gas onto the platform.

In Example 2, Example 1 can optionally include the plasma gas being a mixture.

In Example 3, any one of Examples 1 or 2 can optionally include the plasma gas including a reaction gas and a carrier gas.

In Example 4, Example 3 can optionally include the reaction gas comprises about 2% to about 12% of the plasma gas.

In Example 5, any one of Examples 3 or 4 can optionally the reaction gas being hydrogen or formic acid.

In Example 6, any one of Examples 3-5 can optionally include the carrier gas being helium, neon, argon, krypton, xenon, or nitrogen.

In Example 7, any one of Examples 1-6 can optionally include a plurality of sensors and a circuit. The circuit can be configured to: receive signals from the plurality of sensors, and send signals to a flow component to regulate a flow rate of the plasma gas.

In Example 8, Example 7 can optionally include the signals received from the plurality of sensors indicating a pressure within the chamber and the signals sent to the flow components decrease a flow of the plasma gas.

In Example 9, any one of Examples 7 and 8 can optionally include the signals received from the plurality of sensors indicating a composition of the plasma gas and the signals sent to the flow components increasing or decreasing a flow rate of a constituent component of the plasma gas.

In Example 10, a compression bonding system can be provided. The compression bonding system can include means for creating a plasma gas; means for causing the plasma gas to flow into a chamber defined by a housing; and means for evacuating a reaction product from the chamber. The reaction product can be created by a reaction of a constituent of the plasma gas an oxide layer on a first component to be compression bonded to a second component.

In Example 11, Example 10 can optionally include means for regulating the flow rate of the plasma gas into the chamber.

In Example 12, any one of Examples 10 or 11 can optionally include means for controlling a composition of the plasma gas.

In Example 13, any one of Examples 10-12 can optionally include the plasma gas being a mixture.

In Example 14, any one of Examples 10-13 can optionally include the plasma gas including a reaction gas and a carrier gas.

In Example 15, Example 14 can optionally include the reaction gas comprising about 2% to about 12% of the plasma gas.

In Example 16, any one of Examples 14 or 15 can optionally include the reaction gas being hydrogen or formic acid.

In Example 17, any one of Examples 14-16 can optionally include the carrier gas being helium, neon, argon, krypton, xenon, or nitrogen.

In Example 18, a method for compression bonding a first component to a second component can be provided. The method can include: creating a plasma gas. The plasma gas can include a reaction gas and a carrier gas. The method can further include passing the plasma gas over a surface of the first component. The first component can have an oxide layer on the surface. The method can further include reacting the reaction gas with the oxide layer. The reaction can remove a portion of the oxide layer from the surface of the first component. The method can further include pressing the first component and the second component together to fuse the first component to the second component.

In Example 19, Example 18 can optionally include removing a product of the reaction between the reaction gas and the oxide layer from a vicinity of the surface of the first component.

In Example 20, any one of Examples 18 or 19 can optionally include the reaction gas comprising about 2% to about 12% of the plasma gas.

In Example 21, any one of Examples 18-20 can optionally include the reaction gas being hydrogen or formic acid.

In Example 22, any one of Examples 18-21 can optionally include the carrier gas being helium, neon, argon, krypton, xenon, or nitrogen.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A compression bonding system for bonding components of a chip, the compression bonding system comprising:
    a housing defining a chamber and a plurality of injection points and exhaust points;
    a pump in fluid communication with the exhaust points and configured to withdraw gases from the chamber;
    an injector in fluid communication with the injection points and configured to supply a carrier gas to the chamber;
    a platform located within the chamber and supporting a thermocompression chip bonder;
    a plasma jet located proximate the platform and movable about the thermocompression chip bonder, the plasma jet including a nozzle arranged to direct a plasma gas onto the components of the chip located in the chip bonder
    a plurality of sensors configured to detect a humidity and contaminate levels within the chamber; and
    a circuit configured to:
        receive signals from the plurality of sensors, the signals indicating the humidity and contaminate levels within the chamber, and
        send signals to a flow component to regulate a flow rate of the plasma gas to adjust a concentration of the plasma gas based on the humidity and contaminate levels within the chamber,
    wherein the compression bonding system does not include a de-flux system.

2. The compression bonding system of claim 1, wherein the plasma gas is a mixture.

3. The compression bonding system of claim 1, wherein the plasma gas include a reaction gas and a carrier gas.

4. The compression bonding system of claim 3, wherein the reaction gas comprises about 2% to about 12% of the plasma gas.

5. The compression bonding system of claim 3, wherein the reaction gas includes hydrogen or formic acid.

6. The compression bonding system of claim 3, wherein the carrier gas includes helium, neon, argon, krypton, xenon, or nitrogen.

7. The compression bonding system of claim 1, wherein the signals received from the plurality of sensors indicate a pressure within the chamber and the signals sent to the flow component decreases a flow of the plasma gas.

8. The compression bonding system of claim 1, wherein signals received from the plurality of sensors indicate a composition of the plasma gas and wherein the signals sent to the flow components increase or decrease a flow rate of a constituent component of the plasma gas.

9. A compression bonding system for bonding components of a chip, the compression bonding system comprising:
    means for housing a thermocompression chip bonder;
    means for creating a plasma gas within the housing means;
    means for detecting a humidity and contaminate levels within the chamber;
    means for adjusting a concentration of the plasma gas based on the humidity and contaminate levels within the chamber;
    means for directing the plasma gas to flow onto a surface of the component located within the thermocompression chip bonder, the directing means including an injector in fluid communication with an injection point defined by the housing; and
    means for evacuating a reaction product from the chamber, the reaction product created by a reaction of a constituent of the plasma gas an oxide layer on a first component to be compression bonded to a second component, wherein the evacuating means include a pump in fluid communication with an exhaust point defined by the housing.

10. The compression bonding system of claim 9, further comprising means for regulating the flow rate of the plasma gas into the chamber.

11. The compression bonding system of claim 9, further comprising means for controlling a composition of the plasma gas.

12. The compression bonding system of claim 9, wherein the plasma gas is a mixture.

13. The compression bonding system of claim 9, wherein the plasma gas include a reaction gas and a carrier gas.

14. The compression bonding system of claim 13, wherein the reaction gas comprises about 2% to about 12% of the plasma gas.

15. The compression bonding system of claim 13, wherein the reaction gas includes hydrogen or formic acid.

16. The compression bonding system of claim 13, wherein the carrier gas includes helium, neon, argon, krypton, xenon, or nitrogen.

17. A method for compression bonding a first component of a chip to a second component of the chip, the method comprising:
    injecting a plasma gas into a chamber via a plurality of injection points defined by the chamber so as to create a positive pressure differential between an interior of the chamber and surroundings, the plasma gas including a reaction gas and a carrier gas;
    detecting a humidity and contaminate levels within the chamber;
    adjusting a concentration of the plasma gas based on the humidity and contaminate levels within the chamber;
    passing a plasma jet proximate a first surface of the first component to dispense the plasma gas onto the first surface of the first component, the first component having an oxide layer on the surface, the first component and the second component located in a thermocompression chip bonder;
    reacting the reaction gas with the oxide layer, the reaction removing a portion of the oxide layer from the surface of the first component;
    extracting a product created by reacting the reaction gas with the oxide layer via a plurality of exhaust points defined by the chamber; and
    pressing the first component and the second component together to fuse the first component to the second component.

18. The method of claim 17, further comprising removing a product of the reaction between the reaction gas and the oxide layer from a vicinity of the surface of the first component.

19. The method of claim 17, wherein the reaction gas comprises about 2% to about 12% of the plasma gas.

20. The method of claim 17, wherein the reaction gas includes hydrogen or formic acid.

21. The method of claim 17, wherein the carrier gas includes helium, neon, argon, krypton, xenon, or nitrogen.

22. The method of claim 17, wherein the plasma jet is passed proximate the first surface of the first component at a rate of about 5 mm/s to about 100 mm/s.

23. The method of claim 17, wherein passing the plasma jet is passed proximate the first surface includes passing the plasma jet within about 2 mm to about 10 mm of the first surface.

* * * * *